United States Patent
Shin et al.

(10) Patent No.: US 12,256,603 B2
(45) Date of Patent: Mar. 18, 2025

(54) DISPLAY PANEL INCLUDING A FIRST CONDUCTIVE MEMBER IN A FIRST AREA AND A SECOND CONDUCTIVE MEMBER IN A SECOND AREA

(71) Applicant: LG Display Co., Ltd., Seoul (KR)

(72) Inventors: Mihee Shin, Paju-si (KR); Minha Kang, Paju-si (KR); JuhnSuk Yoo, Paju-si (KR); YongMin Ha, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/518,019

(22) Filed: Nov. 22, 2023

(65) Prior Publication Data

US 2024/0090268 A1  Mar. 14, 2024

Related U.S. Application Data

(63) Continuation of application No. 17/527,912, filed on Nov. 16, 2021, now Pat. No. 12,058,892.

(30) Foreign Application Priority Data

Dec. 16, 2020 (KR) .................. 10-2020-0176852

(51) Int. Cl.
*H01L 29/08* (2006.01)
*H10K 59/121* (2023.01)
(Continued)

(52) U.S. Cl.
CPC ..... *H10K 59/1213* (2023.02); *H10K 59/1216* (2023.02); *H10K 71/00* (2023.02); *H10K 59/1201* (2023.02)

(58) Field of Classification Search
CPC . H10K 59/1213; H10K 71/00; H10K 59/1216
(Continued)

(56) References Cited

U.S. PATENT DOCUMENTS

2015/0243722 A1  8/2015  Kwon et al.
2017/0345881 A1*  11/2017  Kim ................... H10K 59/1213
(Continued)

FOREIGN PATENT DOCUMENTS

CN   106898551 A  *  6/2017  ....... G02F 1/133345
CN   111029390 A  *  4/2020  ........... G06F 3/0412
(Continued)

*Primary Examiner* — Phuc T Dang
(74) *Attorney, Agent, or Firm* — Birch, Stewart, Kolasch & Birch, LLP

(57) ABSTRACT

A display panel can include a first area including a first plurality of subpixels, a second area including a second plurality of subpixels, and at least one light-transmitting portion between adjacent subpixels among the second plurality of subpixels. Also, a first subpixel in the first area includes a first light emitting layer, a first thin film transistor including a first channel area, and a first conductive member disposed under and overlapping with the first channel area of the first thin film transistor, and a second subpixel in the second area includes a second light emitting layer, a second thin film transistor including a second channel area, and a second conductive member disposed under and overlapping with the second channel area of the second thin film transistor. The first conductive member in the first subpixel in the first area is on a higher layer than the second conductive member.

21 Claims, 7 Drawing Sheets

(51) Int. Cl.
*H10K 71/00* (2023.01)
*H10K 59/12* (2023.01)

(58) Field of Classification Search
USPC .......................................................... 257/40
See application file for complete search history.

(56) References Cited

U.S. PATENT DOCUMENTS

2019/0180073 A1* 6/2019 Zhang ................... G06F 3/0412
2020/0373372 A1 11/2020 Chung et al.
2021/0193782 A1 6/2021 Seo et al.
2021/0241671 A1 8/2021 Lee et al.

FOREIGN PATENT DOCUMENTS

| | | | | |
|---|---|---|---|---|
| CN | 111710707 A | * | 9/2020 | ........... G09G 3/3225 |
| EP | 3 933 931 A1 | | 1/2022 | |
| JP | 2003-8205 A | | 1/2003 | |
| KR | 10-2018-0012442 A | | 2/2018 | |

* cited by examiner

DISPLAY PANEL INCLUDING A FIRST CONDUCTIVE MEMBER IN A FIRST AREA AND A SECOND CONDUCTIVE MEMBER IN A SECOND AREA

CROSS-REFERENCE TO RELATED APPLICATION

This application is a Continuation application of U.S. application Ser. No. 17/527,912, filed on Nov. 16, 2021, which claims priority to Korean Patent Application No. 10-2020-0176852, filed on Dec. 16, 2020 in the Korean Intellectual Property Office, where the entire contents of all these applications are expressly incorporated by reference into the present application.

BACKGROUND

Field

The present disclosure relates to a display panel including an imaging area in which pixels for reproducing images are disposed and a method of fabricating the display panel.

Description of Related Art

Electroluminescence display devices are generally classified into inorganic light emitting display devices and organic light emitting display devices according to materials included in an emission layer. An organic light emitting display device of an active matrix type can include an organic light emitting diode (hereinafter, referred to as "OLED") having self-emitting property. The OLED can be disposed on each of the pixels included in the organic light emitting display device.

The organic light emitting display device has an advantage of a short response time, a high luminous efficiency, an excellent luminance, a wide viewing angle, and the like. The organic light emitting display device has a high contrast ratio and excellent color gamut because such a display device can express black in the range of gray levels as complete black.

On the other hand, the multimedia capabilities of mobile terminals have been significantly improved. For example, a camera is built into a smart phone by default, and the resolution of such a camera has been upgraded to the level of a conventional digital camera. However, one or more cameras typically located in an upper portion of the smart phone limits the design of an associated display screen, which can make it difficult to design the screen.

In order to reduce a corresponding space occupied by the camera, a screen design including a notch or punch hole has been adopted in smart phones, but the screen size is still limited due to the camera, and thus, there is a need for implementing a full-screen display.

SUMMARY OF THE DISCLOSURE

To implement a full-screen display, there is proposed a scheme of assigning an imaging area in which low-resolution pixels are disposed in a screen of a display panel and arranging a camera in a position or area opposite to the imaging area under the display panel. The imaging area in the screen acts as a transparent display screen for displaying an image. In such an imaging area according to a related art, corresponding transmittance can be lowered and resulted luminance can be low due to pixels. Further, in order to improve the transmittance, manufacturing costs can be increased by the addition of a process mask for the process of etching a metal, or the like.

To address these issues or limitations associated with the related art, embodiments of the present disclosure described herein provide a display panel capable of enhancing transmittance of an imaging area in a display screen, and a method for simplifying a process of fabricating the display panel.

Issues or needs addressed by the present disclosure are not limited thereto, and other issues or needs will become apparent to those skilled in the art from the following description.

In accordance with one aspect of the present disclosure, a display panel is provided. The display panel includes a first area in which a plurality of pixels are disposed, a second area in which a plurality of pixel groups are disposed, and at least one light-transmitting portion disposed between the plurality of pixel groups in the second area. Each of the one or more light-transmitting portions can be, or include, a circular light-transmitting portion arranged in a zigzag pattern along a first direction and a second direction intersecting the first direction in the second area. Each of the plurality of pixel groups in the second area can include a second electrode. At least part of the second electrode can be removed from a light-transmitting area of the second area to form the light-transmitting portion.

In accordance with another aspect of the present disclosure, a display device including above display panel is provided.

In accordance with another aspect of the present disclosure, a method is provided for fabricating a display panel. Here, the display panel is provided with a display area including a first pixel area in which a plurality of pixels are disposed, and an imaging area including a second pixel area in which a plurality of pixel groups are disposed, and at least one light-transmitting portion disposed between the plurality of pixel groups. The method can include forming a capacitor electrode in the pixel area of the imaging area, and forming the light-transmitting portion by removing at least part of a second electrode of the imaging area through the irradiation of the laser beam using the capacitor electrode as a mask.

In accordance with further another aspect of the present disclosure, a display panel is provided. The display panel can include a first area in which a plurality of pixels are disposed, a second area in which a plurality of pixel groups are disposed, and at least one light-transmitting portion disposed between the plurality of pixel groups in the second area.

Each of the at least one light-transmitting portion can be located in an area in which at least part of a second electrode included in the plurality of pixel groups disposed in the second area is removed. Each of the at least one light-transmitting portion can be located in at least a part of an area except for an area in which a capacitor electrode included in the plurality of pixel groups disposed in the second area is disposed.

The second electrode disposed in the second area can be removed in an area other than an area in which the capacitor electrode disposed in the second area is disposed. The second electrode disposed in the second area can be located in an area overlapping the capacitor electrode disposed in the second area.

In accordance with aspects of the present disclosure, a light-transmitting portion can be patterned by using a lower metal layer without an additional etching mask when removing a metal layer for forming the light-transmitting portion in the imaging area using a laser beam. As a result, an associated display panel can be fabricated with a simplified process and a reduced manufacturing cost.

In accordance with aspects of the present disclosure, by completely removing a metal layer needed to be removed for forming a light-transmitting portion without a residual film, the transmittance of the imaging area can be increased, and a margin between the display area and the imaging area can be minimized.

In accordance with aspects of the present disclosure, by completely removing the metal layer needed to be removed for forming a light-transmitting portion without a residual film, the transmittance of the imaging area can be increased and noises of the captured image data can be reduced.

Effects resulting from embodiments described herein are not limited thereto, and other effects will become apparent to those skilled in the art from the following description.

BRIEF DESCRIPTION OF THE DRAWINGS

The present disclosure will become more fully understood from the detailed description given hereinbelow and the accompanying drawings which are given by way of illustration only, and thus are not limitative of the present disclosure and wherein.

DETAILED DESCRIPTION OF THE EMBODIMENTS

Figure 1:
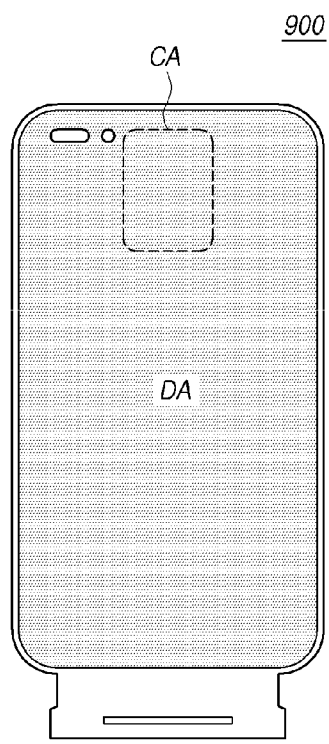
FIG. 1 illustrates schematically a display area and an imaging area in a screen of a display panel according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but can be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description can make the subject matter in some embodiments of the present disclosure rather unclear.

The terms such as "including", "having", "containing", "comprising of", and "consist of" used herein are generally intended to allow other components to be added unless the terms are used with the term "only". Singular forms used herein are intended to include plural forms unless the context clearly indicates otherwise. Further, a term "module" can represent a unit, an element, a part, a component, a device, etc.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, can be used to describe one element or feature's relationship to another element(s) or feature(s) as illustrated in the figures, and it should be interpreted that one or more elements can be further "interposed" between the elements unless the terms such as 'directly', "only" are used.

In accordance with embodiments of the present disclosure, When the terms, such as "first", "second", or the like, are used to describe various elements or components, it should be considered that corresponding elements or components are not limited to the meaning of these terms. For example, these terms are merely used for distinguishing an element or component from one or more other elements or components, and may not define order. Therefore, a first element mentioned below can be a second element within a technical concept of the present disclosure.

Like reference numerals generally denote like elements throughout the present specification.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, with reference to the accompanying drawings, various embodiments of the present disclosure will be described in detail. All the components of each display panel and each display device according to all embodiments of the present disclosure are operatively coupled and configured.

Referring to FIG. 1, a screen of a display panel 900 includes at least a first area DA (also referred to as a display area) and a second area CA (also referred to as an imaging area).

The display area DA and the imaging area CA include a pixel array in which pixels to which pixel data are written are arranged. The number of pixels per unit area of the imaging area CA, for example, pixels per inch (PPI), can be lower than that of the display area DA in order to ensure the transmittance of the imaging area CA.

The pixel array of the display area DA can include a pixel area (i.e., the first pixel area) in which a plurality of pixels having a relative high PPI is disposed. The pixel array of the imaging area CA can be spaced apart by at least one light-transmitting portion and include a pixel area (i.e., the second pixel area) in which a plurality of pixel groups having a relative low PPI is disposed. In the imaging area CA, external light can pass through the display panel 900 through at least one light-transmitting portion having a high light transmittance and can be received by a camera module or an image capture module under the display panel 900.

As the display area DA and the imaging area CA include pixels, input images can be reproduced in the display area DA and the imaging area CA.

Each of pixels in the display area DA and the imaging area CA includes sub-pixels having different colors to implement images with colors. Each sub-pixel can be one of a red sub-pixel (hereinafter, referred to as "R sub-pixel"), a green sub-pixel (hereinafter, referred to as "G sub-pixel"), and a blue sub-pixel (hereinafter, referred to as "B sub-pixel"). Each pixel P can further include a white sub-pixel (hereinafter" referred to as "W sub-pixel"). Each sub-pixel can include a pixel circuit and a light emitting element, such as a light emitting diode, more specifically, an organic light emitting diode (OLED).

The imaging area CA can include pixels, and a camera module or an image capture module (hereinafter, referred to as "image capture module") disposed under the screen of the display panel 900. In a display mode, by writing pixel data of input images in the pixels of the imaging area CA, the input images can be displayed in the imaging area CA in which the image capture module including a lens is located. In an image capture mode, the image capture module can capture external still or moving images and output still or moving image data. The lens of the image capture module can face the imaging area CA. As external light enters the imaging area CA and reaches the lens of the image capture module, then, the lens can condense the incident light to an image sensor. In the image capture mode, the image capture module captures external still or moving images and outputs still or moving image data.

In order to ensure transmittance, an image quality compensation algorithm can be applied for compensating for the luminance and color coordinates of pixels in the imaging area CA due to pixels removed from the imaging area CA.

According to embodiments described herein, since pixels configured with low resolution are arranged in the imaging area CA, the display area of the screen may not be limited due to the image capture module, and therefore, full-screen display can be implemented.

In FIG. 1, as described in detail later, the display panel 900 included in a display device according to embodiments of present disclosure can include a circuit layer disposed over a substrate, and a light emitting element layer disposed over the circuit layer. A polarizing plate can be disposed over the light emitting element layer, and a cover glass can be disposed on or over the polarizing plate.

The circuit layer can include a pixel circuit connected to lines such as data lines, gate lines, and power lines, and a gate driver connected to the gate lines, and the like. The circuit layer can include circuit elements such as transistors, for example, thin film transistors (TFT), at least one capacitor, and the like. The lines and circuit elements of the circuit layer can be implemented or disposed in or with a plurality of insulating layers, two or more metal layers separated by an insulating layer therebetween, and an active layer including a semiconductor material.

The light emitting element layer can include a light emitting element driven by a pixel circuit. The light emitting element can be implemented as an organic light emitting diode (OLED). The OLED includes an organic compound layer located between an anode and a cathode. The organic compound layer can include a hole injection layer (HIL), a hole transport layer (HTL), an emission layer (EML), an electron transport layer (ETL), an electron injection layer (EIL) and the like; however, embodiments of the present disclosure are not limited thereto. When voltages are applied to the anode and cathode of the OLED, holes passing through the hole transport layer HTL and electrons passing through the electron transport layer ETL can move to the emission layer EML, and then form excitons. Thereby, visible light can be emitted from the emission layer EML. The light emitting element layer can be disposed on or over pixels that selectively transmit respective wavelengths of red light, green light, and blue light, and further include a color filter array.

The light emitting element layer can be covered by a passivation layer, and the passivation layer can be covered by an encapsulation layer. The passivation layer and the encapsulation layer can have a multilayer structure in which one or more organic films and one or more inorganic films are alternately stacked. The inorganic film can block the penetration of moisture or oxygen. The organic film can enable a surface of the inorganic film to be flat. In the multilayer structure stacked with one or more organic films and one or more inorganic films, a path through which moisture or oxygen travels can become longer when compared with a structure having a single layer, and therefore, the penetration of moisture/oxygen affecting the light emitting element layer can be effectively prevented or reduced.

The polarizing plate can be adhered to the encapsulation layer. The polarizing plate leads to the improvement of outdoor visibility of the display device. The polarizing plate can reduce light reflected from a surface of the display panel 900 and block light reflected from a metal of the circuit layer, thereby improving brightness of pixels.

Figure 2:
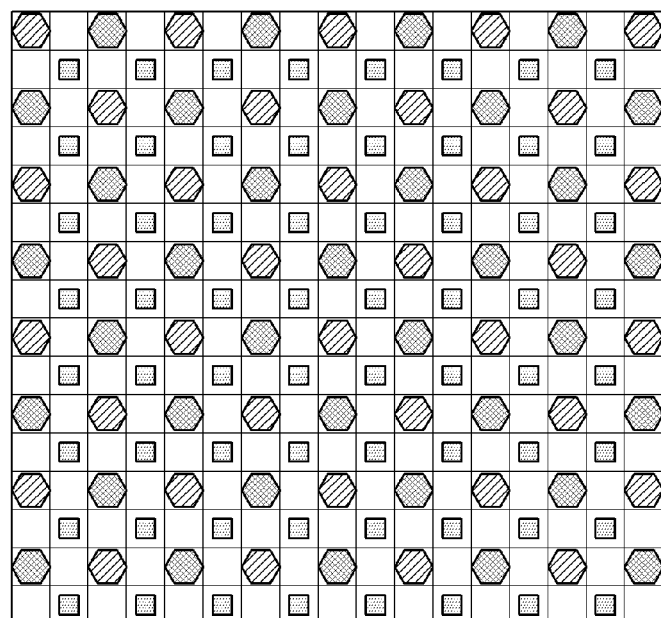
FIG. 2 illustrates schematically an arrangement of pixels in a first area (display area DA) in the display panel according to aspects of the present disclosure.

FIG. 2 illustrates an example of pixels arranged in the first area DA.

Figure 3:
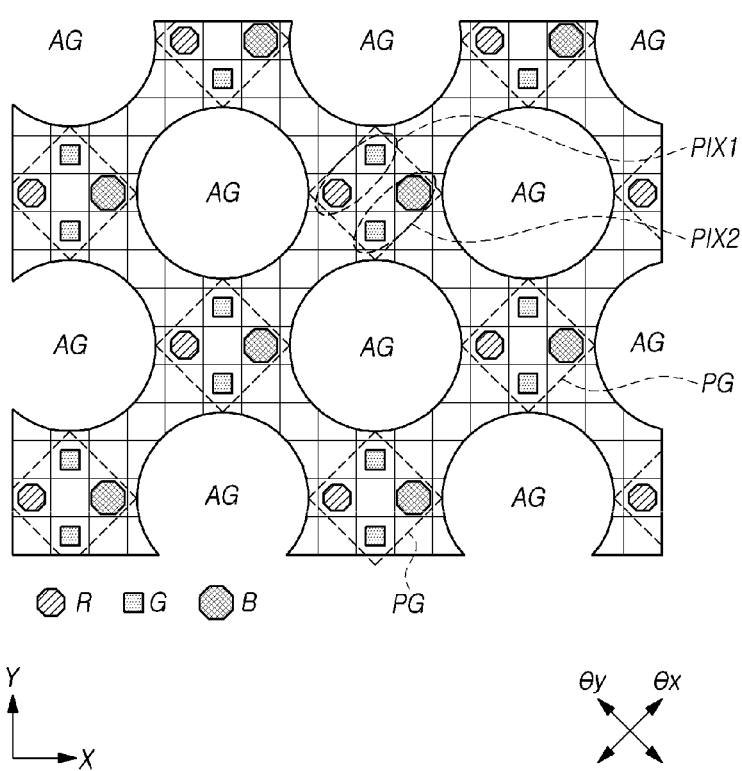
FIG. 3 illustrates schematically an arrangement of pixel groups and at least one light-transmitting portion in a second area (imaging area CA) in the display panel according to aspects of the present disclosure.

FIG. 3 illustrates an example of pixel groups and light-transmitting portions disposed in the second area CA. In FIGS. 2 and 3, lines connected to pixels are omitted.

Referring to FIG. 2, the first area DA includes pixels arranged in a high PPI. Each of the pixels can include R, G and B sub-pixels or can include two sub-pixels of different colors. Each of the pixels can further include a W sub-pixel omitted in the drawings. Other variations of pixel arrangement are possible in the first area DA.

Luminous efficiency of respective light emitting elements included in sub-pixels can be different on a color basis. Taking account of this, sizes of the sub-pixels can be different on a color basis. For example, B sub-pixels of R, G, and B sub-pixels, can be the largest and G sub-pixels can be the smallest.

The pixels can be arranged along a first direction (e.g., an X-axis direction), a second direction (e.g., a Y-axis direction) perpendicular to the first direction, and an inclined angle direction between the first and second directions (e.g., a direction defined by ΘX-axis and ΘY-axis). Here, the direction defined by ΘX-axis and ΘY-axis denotes an inclined direction in which the X-axis and Y-axis are rotated by 45°, respectively.

Referring to FIG. 3, pixels included in the second area CA can be organized into a plurality of pixel groups PG each including one or two pixels. The pixel groups PG may be spaced apart by a predetermined distance from one another. Each light-transmitting portion AG can be disposed in a space between the pixel groups PG. External light can be incident on the lens of the image capture module through light-transmitting portions AG. The light-transmitting portions AG can include transparent media having high transmittance without including a metal so that the light can be incident with minimal light loss. In other words, the light-transmitting portions AG can be formed of transparent insulating materials without including metal lines or pixels. The transmittance of the imaging area CA increases as the number, or the size, of the light-transmitting portions AG increase. Therefore, as the light-transmitting portions AG are disposed between the pixel groups PG, the PPI of the second area CA becomes lower than the PPI of the first area DA.

Each of the pixel groups PG can include one or two pixels, or can include three or four sub-pixels (R, G, and/or B sub-pixels). Furthermore, each of the pixel groups PG can further include one or more W sub-pixels. Other variations of pixel arrangement are possible in the second area CA or in the pixel groups PG.

As illustrated in FIG. 3, each pixel group PG disposed in the second area CA can include four sub-pixels. Each pixel group PG can include two pixels PIX1 and PIX2. The first pixel PIX1 can include R and G sub-pixels, and the second pixel PIX2 can include B and G sub-pixels; however, embodiments of the present disclosure are not limited thereto. Using a sub-pixel rendering algorithm, resulting insufficient color representation in each of the first and second pixels PIX1 and PIX2 can be compensated for by an average value of corresponding color data between neighboring pixels. The white color can be expressed by combining R, G, and B sub-pixels of the first and second pixels PIX1 and PIX2.

The light-transmitting portions AG can have various shapes. In one embodiment, the light-transmitting portions AG can have a circular or elliptical shape, or similar thereto, in order to obtain a captured image with a minimized flare phenomenon and increasing transmittance. In this situation, the pixel group PG can be designed to have a rhombus or square shape in order to enlarge light-transmitting portions AG with the circular or elliptical shape or similar thereto. The light-transmitting portions AG can be defined as areas in the screen, in which all metal layers are removed.

All or some of one or metal electrode materials in the light-transmitting portions AG can be removed. In methods of fabricating the display panel, a metal used as a cathode electrode can be uniformly deposited on the entire screen, and then, parts of the deposited material corresponding to only the light-transmitting portions AG of the imaging area CA can be removed in a laser process.

Each of the pixel groups PG includes a circuit layer where respective pixel circuits of the sub-pixels are disposed and a light emitting element layer, as described above. At least a part of the circuit layer can overlap, or be spatially separated from, at least a part of the light emitting element layer. The circuit layer of the pixel group PG can be disposed in a rhombus or square shape.

Figure 4:
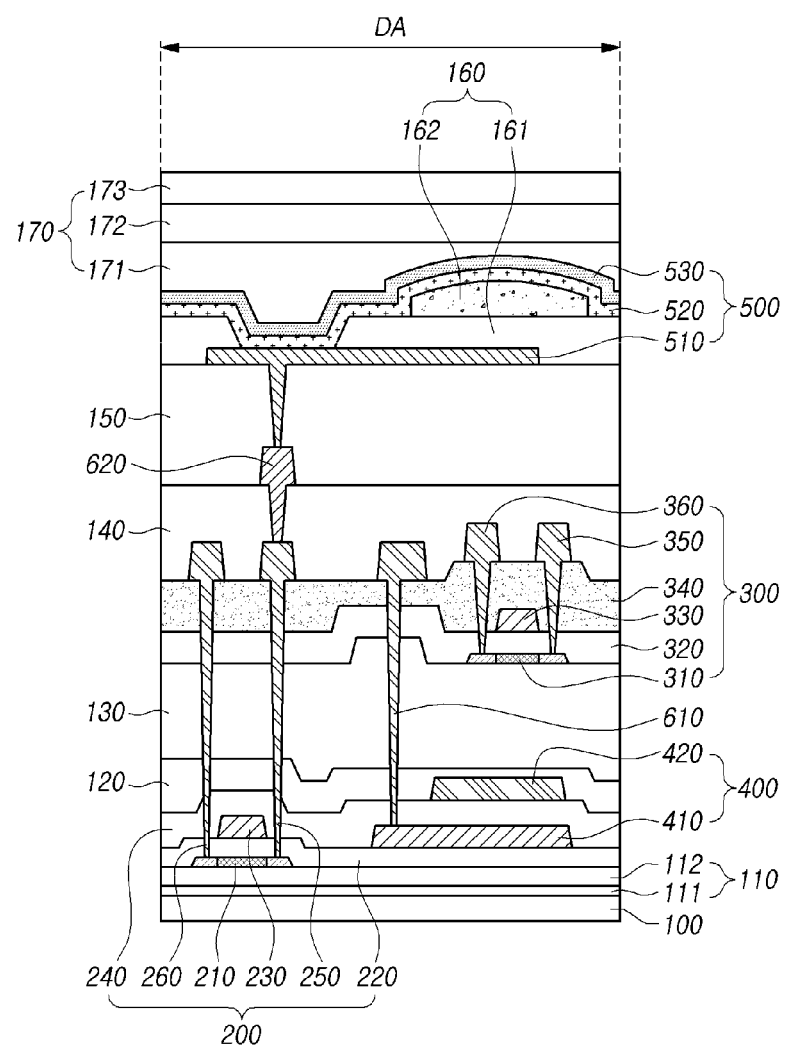
FIG. 4 illustrates specifically a cross-sectional structure of a pixel in the first area DA of the display panel according to aspects of the present disclosure.

FIG. 4 illustrates specifically a cross-sectional structure of a sub-pixel in the first area DA of the display panel according to aspects of the present disclosure.

Referring to FIG. 4, sub-pixels defined by gate lines and data lines are disposed over a substrate 100. A light emitting element 500 can be located in each sub-pixel. Each light emitting element 500 can emit light representing a specific color. For example, each light emitting element 500 can include a first electrode 510, an emission layer 520, and a second electrode 530, which are sequentially stacked.

The first electrode 510 can include a conductive material. The first electrode 510 can include a metal having a relatively high reflectivity. The first electrode 510 can have a multilayer structure. For example, the first electrode 510 can have a structure in which a reflective electrode formed of a metal such as aluminum (Al), silver (Ag), or the like is located between transparent electrodes formed of a transparent conductive material such as ITO, IZO, or the like.

The emission layer 520 can generate light having a luminance level corresponding to a voltage difference between the first electrode 510 and the second electrode 530. For example, the emission layer 520 can include a light emitting material layer EML including a light emitting material. The light emitting material can include an organic material, an inorganic material, or a hybrid material. For example, the display device according to aspects of the present disclosure can be an organic light emitting display device including the emission layer 520 formed of an organic material.

The emission layer 520 can have a multilayer structure in order to increase luminous efficiency. For example, the emission layer 520 can further include at least one first organic layer located between the first electrode 510 and the light emitting material layer, and at least one second organic layer located between the light emitting material layer and the second electrode 530. The first organic layer can include at least one of a hole injection layer HIL and a hole transport layer HTL. The second organic layer can include at least one of an electron transport layer ETL and an electron injection layer EIL. However, embodiments of the present disclosure are not limited thereto. For example, the first organic layer can include at least one of the electron transport layer ETL and the electron injection layer EIL, and the second organic layer can include at least one of the hole injection layer HIL and the hole transport layer HTL.

The second electrode 530 can include a conductive material. The second electrode 530 can include a material different from the first electrode 510. For example, the second electrode 530 can be a transparent electrode formed of a transparent conductive material such as ITO, IZO, or the like. Accordingly, in the display device according to embodiments described herein, light generated by the emission layer 520 of each pixel can travel toward the outside through the second electrode 530.

In order to prevent moisture from penetrating into the light emitting element 500, an encapsulation portion 170 can be disposed to cover the light emitting element 500. For example, the encapsulation portion 170 for preventing penetration of moisture can be disposed on the second electrode 530 of the light emitting element 500.

The encapsulation portion 170 can include at least one inorganic encapsulation layer and at least one organic encapsulation layer. For example, the encapsulation portion 170 can include a first encapsulation layer 171 including an inorganic material, a second encapsulation layer 172 including an organic material, and a third encapsulation layer 173 including an inorganic material. The first encapsulation layer 171 of the encapsulation portion 170 can be disposed on the second electrode 530. The second encapsulation layer 172 can be disposed on the first encapsulation layer 171. The third encapsulation layer 173 can be disposed on the second encapsulation layer 172. The first encapsulation layer 171 and the third encapsulation layer 173 of the encapsulation portion 170 can be formed of an inorganic material such as silicon nitride (SiNx), silicon oxide (SiOx), or the like. The second encapsulation layer 172 of the encapsulation portion 170 can be formed of an organic materials such as an acrylic resin, an epoxy resin, a phenolic resin, a polyamide resin, a polyimide resin, or the like.

A driving current corresponding to a gate signal supplied through a corresponding gate line and a data signal supplied through a corresponding data line can be supplied to each light emitting element 500. For example, a driving circuit electrically connected to the light emitting element 500 can be located in each pixel. The driving circuit can control the operation of the light emitting element 500 according to the gate signal and the data signal. For example, the driving circuit can include a first thin film transistor 200, a second thin film transistor 300, and a storage capacitor 400.

The first thin film transistor 200 can include a first semiconductor pattern 210, a first gate insulating film 220, a first gate electrode 230, a first interlayer insulating film 240, and a first source electrode 250, and a first drain electrode 260.

The first semiconductor pattern 210 can be located close to the substrate 100. The first semiconductor pattern 210 can include a semiconductor material. For example, the first semiconductor pattern 210 can include poly-silicon (Poly-Si), which is a polycrystalline semiconductor material. In some embodiments, the first semiconductor pattern 210 can include low temperature poly-silicon (LTPS).

The first semiconductor pattern 210 can include a first source region, a first drain region, and a first channel region. The first channel region can be located between the first source region and the first drain region. The first channel region can have a relatively lower conductivity than the first source region and the first drain region. For example, the first source region and the first drain region can have a higher content of conductivity type impurities than the first channel region.

The first gate insulating film 220 can be disposed on the first semiconductor pattern 210. The first gate insulating film 220 can extend beyond two side outer edges of the first semiconductor pattern 210. The first gate insulating film 220 can include an insulating material. For example, the first gate insulating film 220 can include a silicon oxide-based (SiOx) material. The silicon oxide-based (SiOx) material can include silicon dioxide ($SiO_2$).

The first gate electrode 230 can be located on the first gate insulating film 220. For example, the first gate electrode 230 can overlap a first channel region of the first semiconductor pattern 210. The first gate electrode 230 can be insulated from the first semiconductor pattern 210 due to the first gate insulating film 220 located therebetween. The first gate electrode 230 can include a conductive material. For example, the first gate electrode 230 can include a metal such as aluminum (Al), chromium (Cr), copper (Cu), titanium (Ti), molybdenum (Mo), tungsten (W), or the like.

The first interlayer insulating film 240 can be disposed on or over the first gate insulating film 220 and the first gate electrode 230. The first interlayer insulating film 240 can extend along the first gate insulating film 220. The first interlayer insulating film 240 can include an insulating material. The first interlayer insulating film 240 can include a material different from the first gate insulating film 220. For example, the first interlayer insulating film 240 can include a silicon nitride-based material (SiNx).

The first source electrode 250 can be electrically connected to the first source region of the first semiconductor pattern 210. The first interlayer insulating film 240 can include a first source contact hole exposing a part of the first source region of the first semiconductor pattern 210. A part of the first source electrode 250 can overlap the first source region of the first semiconductor pattern 210.

The first source electrode 250 can include a conductive material. For example, the first source electrode 250 can include a metal such as aluminum (Al), chromium (Cr), molybdenum (Mo), tungsten (W), titanium (Ti), copper (Cu), or the like.

The first drain electrode 260 can be electrically connected to the first drain region of the first semiconductor pattern 210. The first interlayer insulating film 240 can include a first drain contact hole exposing a part of the first drain region of the first semiconductor pattern 210. A part of the first drain electrode 260 can overlap the first drain region of the first semiconductor pattern 210.

The first drain electrode 260 can include a conductive material. For example, the first drain electrode 260 can include a metal such as aluminum (Al), chromium (Cr), molybdenum (Mo), tungsten (W), titanium (Ti), copper (Cu), or the like. The first drain electrode 260 can include the same material as the first source electrode 250. For example, the first drain electrode 260 can be formed by the same process as the first source electrode 250.

The first source electrode 250 and the first drain electrode 260 can have a multilayer structure. For example, the first source electrode 250 and the first drain electrode 260 can be made up of three layers. When the first source electrode 250 and the first drain electrode 260 are made up of three layers, the top layer and the bottom layer can be a titanium (Ti) metal layer, and the intermediate layer located between the top layer and the bottom layer can be an aluminum (Al) metal layer.

The second thin film transistor 300 can be formed through a process different from that of the first thin film transistor 200. For example, the second thin film transistor 300 can be located on a second separation insulating film 130 of the first thin film transistor 200. The second separation insulating film 130 can include an insulating material. The second separation insulating film 130 can include a material different from the first interlayer insulating film 240. For example, the second separation insulating film 130 can include a silicon oxide-based (SiOx) material.

The second thin film transistor 300 can have the same structure as the first thin film transistor 200. For example, the second thin film transistor 300 can include a second semiconductor pattern 310, a second gate insulating film 320, a second gate electrode 330, and a second interlayer insulating film 340, a second source electrode 350, and a second drain electrode 360.

The second semiconductor pattern 310 can be located close to the second separation insulating film 130. For example, the second semiconductor pattern 310 can directly contact the second separation insulating film 130. The second semiconductor pattern 310 can include a semiconductor material. The second semiconductor pattern 310 can include a material different from the first semiconductor pattern 210. For example, the second semiconductor pattern 310 can include an oxide semiconductor such as IGZO, or the like.

The second semiconductor pattern 310 can include a second source region, a second drain region, and a second channel region. The second channel region can be located between the second source region and the second drain region. Resistance of the second source region and resistance of the second drain region can be lower than resistance of the second channel region. For example, the second source region and the second drain region can be regions modified to act as a conducting material. The second channel region can be a region not modified to act as a conducting material. For example, a doping process can be performed for enabling the second source region and the second drain region to act as a conducting material.

The second gate insulating film 320 can be located on the second semiconductor pattern 310. The second gate insulating film 320 can include an insulating material. For example, the second gate insulating film 320 can include a silicon oxide-based (SiOx) material, a silicon nitride-based (SiNx) material, and/or a material with a high dielectric constant (high-k material). The second gate insulating film 320 can have a multilayer structure.

The second gate electrode 330 can be located on the second gate insulating film 320. For example, the second gate electrode 330 can overlap a second channel region of the second semiconductor pattern 310. For example, the second gate insulating film 320 can include a second source contact hole and a second drain contact hole which expose at least a part of the second source region, and at least a part of the second drain region, of the second semiconductor pattern 310, respectively.

The second gate electrode 330 can include a conductive material. For example, the second gate electrode 330 can include a metal such as aluminum (Al), chromium (Cr), copper (Cu), titanium (Ti), molybdenum (Mo), tungsten (W), or the like. The second gate electrode 330 can include the same material as the first gate electrode 230.

The second interlayer insulating film 340 can be disposed on or over the second semiconductor pattern 310 and the second gate electrode 330. The second interlayer insulating film 340 can include an insulating material. The second interlayer insulating film 340 can include a material different from the first interlayer insulating film 240. For example, the second interlayer insulating film 340 can include a silicon oxide-based material (SiOx).

The second source electrode 350 can be located on the second interlayer insulating film 340. The second source electrode 350 can be electrically connected to the second source region of the second semiconductor pattern 310. For example, the second interlayer insulating film 340 can include a second source contact hole exposing at least a part of the second source region of the second semiconductor pattern 310. A part of the second source electrode 350 can overlap the second source region of the second semiconductor pattern 310.

The second source electrode 350 can include a conductive material. For example, the second source electrode 350 can include a metal such as aluminum (Al), chromium (Cr), molybdenum (Mo), tungsten (W), titanium (Ti), copper (Cu), or the like. The second source electrode 350 can include the same material as the first source electrode 250.

The second drain electrode 360 can be located on the second interlayer insulating film 340. The second drain electrode 360 can be electrically connected to the second drain region of the second semiconductor pattern 310. For example, the second interlayer insulating film 340 can include a second drain contact hole exposing at least a part of the second drain region of the second semiconductor pattern 310. A part of the second drain electrode 360 can overlap the second drain region of the second semiconductor pattern 310.

The second drain electrode 360 can include a conductive material. For example, the second drain electrode 360 can include a metal such as aluminum (Al), chromium (Cr), molybdenum (Mo), tungsten (W), titanium (Ti), copper (Cu), or the like. The second drain electrode 360 can include the same material as the second source electrode 350. For example, the second drain electrode 360 can be formed by the same process as the second source electrode 350.

The second source electrode 350 and the second drain electrode 360 can have a multilayer structure. For example, the second source electrode 350 and the second drain electrode 360 can be made up of three layers. When the second source electrode 350 and the second drain electrode 360 are made up of three layers, the top layer and the bottom layer can be a titanium (Ti) metal layer, and the intermediate layer located between the top layer and the bottom layer can be an aluminum (Al) metal layer.

The first source electrode 250 and the first drain electrode 260, the second source electrode 350, and the second drain electrode 360 are located on the second interlayer insulating film 340, and can be formed in the same process and formed of the same material.

The storage capacitor 400 can be formed between the substrate 100 and the second thin film transistor 300. For example, the storage capacitor 400 can include a first storage electrode 410 disposed on the same layer as the first gate electrode 230 and a second storage electrode 420 disposed over the first storage electrode 410.

The first storage electrode 410 can include a conductive material. The first storage electrode 410 can include a metal such as aluminum (Al), chromium (Cr), molybdenum (Mo), tungsten (W), titanium (Ti), copper (Cu), or the like. The first storage electrode 410 can include the same material as the first gate electrode 230. For example, the first storage electrode 410 can be formed by the same process as the first gate electrode 230.

The second storage electrode 420 can include a conductive material. The second storage electrode 420 can include a metal such as aluminum (Al), chromium (Cr), molybdenum (Mo), tungsten (W), titanium (Ti), copper (Cu), or the like. The first interlayer insulating film 240 can extend to run between the first storage electrode 410 and the second storage electrode 420. The second storage electrode 420 can be located on the first interlayer insulating film 240.

The first source electrode 250 and the first drain electrode 260 can be located on a layer different from the first storage electrode 420. For example, a first separation insulating film 120 covering the second storage electrode 420 can run between the first interlayer insulating film 240 and the first source electrode 250 and between the first interlayer insulating film 240 and the first drain electrode 260.

The first interlayer insulating film 240 and the first separation insulating film 120 can be sequentially stacked between the first gate electrode 230 and the first source electrode 250 and between the first gate electrode 230 and the first drain electrode 260. The second storage electrode 420 can include a material different from the first source electrode 250 and the first drain electrode 260.

The first separation insulating film 120 can include an insulating material. For example, the first separation insulating film 120 can include a silicon oxide-based material (SiOx) and/or a silicon nitride-based material (SiNx). The first separation insulating film 120 can have a multilayer structure. The first source electrode 250 and the first drain electrode 260 can be located on the second interlayer insulating film 340. However, embodiments of the present disclosure are not limited thereto.

The first storage electrode 410 can be electrically connected to the second drain electrode 360 of the second thin film transistor 300. For example, a first intermediate electrode 610 can be disposed that is connected to the first storage electrode 410 by passing through the first interlayer insulating film 240, the first separation insulating film 120, the second separation insulating film 130, the second gate insulating film 320, and the second interlayer insulating film 340. In this situation, the second drain electrode 360 can be connected to the first intermediate electrode 610. The first intermediate electrode 610 can include a conductive material. For example, the first intermediate electrode 610 can include a metal such as aluminum (Al), chromium (Cr), molybdenum (Mo), tungsten (W), titanium (Ti), copper (Cu), or the like. The first intermediate electrode 610 can include the same material as the first source electrode 250, the first drain electrode 260, the second source electrode 350, and the second drain electrode 360. For example, the first intermediate electrode 610 can be formed by the same process as the first source electrode 250, the first drain electrode 260, the second source electrode 350, and the second drain electrode 360.

A buffer insulating film 110 can be located between the substrate 100 and a driving circuit (e.g., at least one thin film transistor and at least one storage capacitor) of each sub-pixel. The buffer insulating film 110 can prevent contamination by the substrate 100 in a process of forming the driving circuit. For example, the buffer insulating film 110 can run between the substrate 100 and the first semiconductor pattern 210 of each sub-pixel. The buffer insulating film 110 can include an insulating material. For example, the buffer insulating film 110 can include a silicon oxide-based (SiOx) material and/or a silicon nitride-based (SiNx) material. The buffer insulating film 110 can have a multilayer structure. For example, the buffer insulating film 110 can have a stacked structure including a first buffer insulating film 111 and a second buffer insulating film 112 including a material different from that of the first buffer insulating film 111.

A first planarization layer 140 and a second planarization layer 150 can be sequentially stacked between the second thin film transistor 300 and the light emitting element 500 of each sub-pixel. The first planarization layer 140 and the second planarization layer 150 can remove a step difference due to a driving circuit of each pixel. For example, a surface of the second planarization layer 150 facing the light emitting element 500 of each sub-pixel can be a flat surface. The first planarization layer 140 and the second planarization layer 150 can include an insulating material. The first planarization layer 140 and the second planarization layer 150 can include a material different from the second interlayer insulating film 340. For example, the first planarization layer 140 and the second planarization layer 150 can include an organic insulating material. The second planarization layer 150 can include a material different from the first planarization layer 140.

The light emitting element 500 of each sub-pixel can be electrically connected to the first thin film transistor 200 of the corresponding pixel, and the first electrode 510 can be electrically connected to the first drain electrode 260 through a first connection electrode 620. For example, the first connection electrode 620 can be located between the first planarization layer 140 and the second planarization layer 150. The first connection electrode 620 can be connected to the first drain electrode 260 by passing through the first planarization layer 140, and the first electrode 510 can be connected to the first connection electrode 620 by passing through the second planarization layer 150.

The first connection electrode 620 can include a conductive material. For example, the first connection electrode 620 can include a metal such as aluminum (Al), chromium (Cr), molybdenum (Mo), tungsten (W), titanium (Ti), copper (Cu), or the like.

The light emitting element 500 of each sub-pixel can be independently driven. For example, the first electrode 510 of each sub-pixel can be insulated from the first electrode 510 of an adjacent sub-pixel. An edge of each first electrode 510 can be covered by a bank/spacer insulating film 160 including a bank insulating film 161 and a spacer insulating film 162. The bank/spacer insulating film 160 can be located on the second planarization layer 150. The emission layer 520 and the second electrode 530 of each pixel can be disposed on the corresponding first electrode 510 exposed by the bank/spacer insulating film 160. The bank/spacer insulating film 160 can include an insulating material. For example, the bank/spacer insulating film 160 can include an organic insulating material. The bank/spacer insulating film 160 can include a material different from that of the second planarization layer 150.

At least a part of the emission layer 520 of each sub-pixel can extend to run along the bank/spacer insulating film 160. For example, the first organic layer and the second organic layer of each sub-pixel can be connected to the first organic layer and the second organic layer of an adjacent sub-pixel, respectively. The light emitting material layer EML of each sub-pixel can be spaced apart from the light emitting material layer EML of an adjacent sub-pixel. The second electrode 530 of each pixel can extend to run along the bank/spacer insulating film 160. For example, the second electrode 530 of each sub-pixel can be connected to the second electrode 530 of an adjacent pixel.

According to embodiments described herein, the first thin film transistor 200 can serve as a driving transistor. Accordingly, the first electrode 510 of the light emitting element 500 can be connected to the first thin film transistor 200; however, embodiments of the present disclosure are not limited thereto. For example, the first electrode 510 of the light emitting element 500 can be connected to the second thin film transistor 300. The second thin film transistor 300 can serve as a driving transistor.

Figure 5:
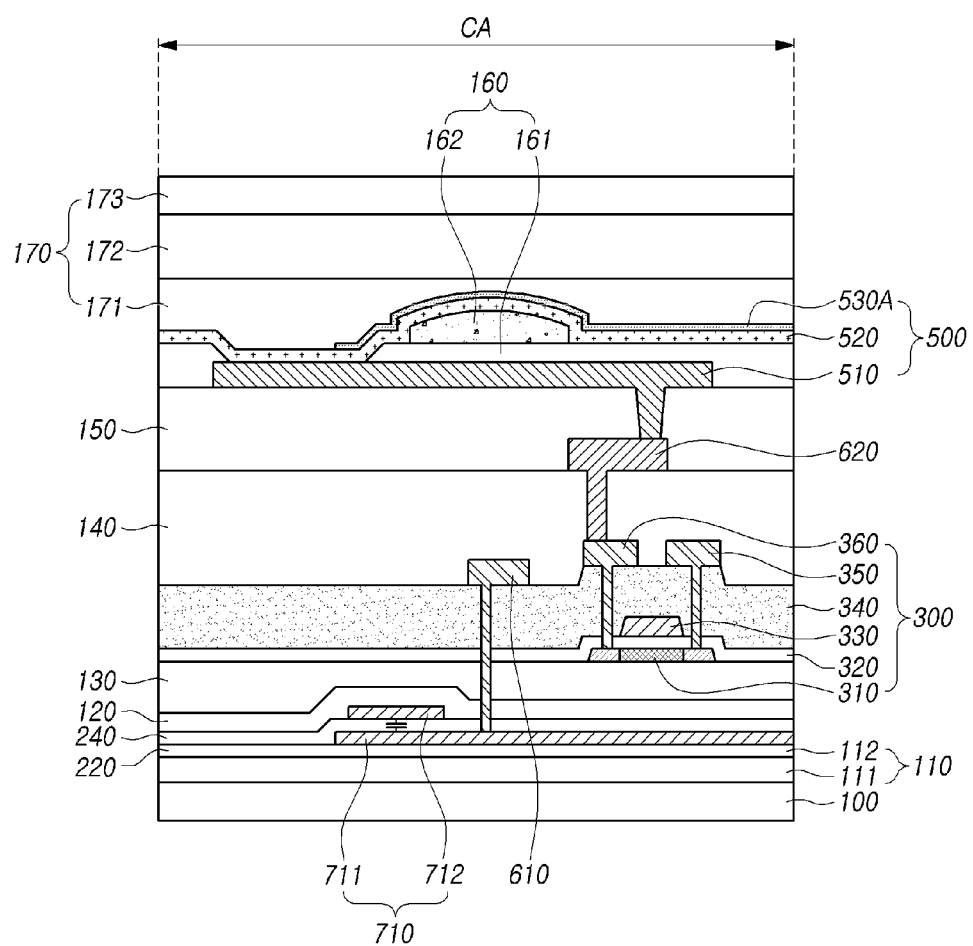
FIGS. 5 to 7 are cross-sectional views illustrating a pixel including a light-transmitting portion of the second area CA in the display panel in various embodiments according to aspects of the present disclosure.

FIG. 5 illustrates specifically a cross-sectional structure of a sub-pixel in the second area CA of the display panel according to aspects of the present disclosure.

Referring to FIG. 5, the process of disposing a second thin film transistor 300, a light emitting element 500, an encapsulation portion 170, a bank/spacer insulating film 160, and the like included in the second area CA of the display panel 900 according to aspects of the present disclosure can substantially equal to the process of disposing the elements of the first region DA illustrated in FIG. 4.

A substrate 100 of the second area CA can include sub-pixels defined by gate lines and data lines. A light emitting element 500 can be located in each sub-pixel. Each light emitting element 500 can emit light representing a specific color. For example, each light emitting element 500 can include a first electrode 510, an emission layer 520, and a second electrode 530A, which are sequentially stacked.

The first electrode 510 can include a conductive material. The first electrode 510 can include a metal having a relatively high reflectivity. The first electrode 510 can have a multilayer structure. For example, the first electrode 510 can have a structure in which a reflective electrode formed of a metal such as aluminum (Al), silver (Ag), or the like is located between transparent electrodes formed of a transparent conductive material such as ITO, IZO, or the like.

The emission layer 520 can generate light having a luminance level corresponding to a voltage difference between the first electrode 510 and the second electrode 530A. For example, the emission layer 520 can include a light emitting material layer EML including a light emitting material. The light emitting material can include an organic material, an inorganic material, or a hybrid material. For example, the display device according to aspects of the present disclosure can be an organic light emitting display device including the emission layer 520 formed of an organic material.

The emission layer 520 can have a multilayer structure in order to increase luminous efficiency. For example, the emission layer 520 can further include at least one first organic layer located between the first electrode 510 and the light emitting material layer, and at least one second organic layer located between the light emitting material layer and the second electrode 530A. The first organic layer can include at least one of a hole injection layer HIL and a hole transport layer HTL. The second organic layer can include at least one of an electron transport layer ETL and an electron injection layer EIL. However, embodiments of the present disclosure are not limited thereto. For example, the first organic layer can include at least one of the electron transport layer ETL and the electron injection layer EIL, and the second organic layer can include at least one of the hole injection layer HIL and the hole transport layer HTL.

The second electrode 530A can include a conductive material. The second electrode 530A can include a material different from the first electrode 510. For example, the second electrode 530A can be a transparent electrode formed of a transparent conductive material such as ITO, IZO, or the like. Accordingly, in the display device according to embodiments described herein, light generated by the emission layer 520 of each pixel can travel toward the outside through the second electrode 530A.

In order to prevent moisture from penetrating into the light emitting element 500, an encapsulation portion 170 can be disposed to cover the light emitting element 500. For example, the encapsulation portion 170 for preventing penetration of moisture can be disposed on the second electrode 530A of the light emitting element 500.

The encapsulation portion 170 can include at least one inorganic encapsulation layer and at least one organic encapsulation layer. For example, the encapsulation portion 170 can include a first encapsulation layer 171 including an inorganic material, a second encapsulation layer 172 including an organic material, and a third encapsulation layer 173 including an inorganic material. The first encapsulation layer 171 of the encapsulation portion 170 can be disposed on the second electrode 530A. The second encapsulation layer 172 can be disposed on the first encapsulation layer 171. The third encapsulation layer 173 can be disposed on the second encapsulation layer 172. The first encapsulation layer 171 and the third encapsulation layer 173 of the encapsulation portion 170 can be formed of an inorganic material such as silicon nitride (SiNx), silicon oxide (SiOx), or the like. The second encapsulation layer 172 of the encapsulation portion 170 can be formed of an organic materials such as an acrylic resin, an epoxy resin, a phenolic resin, a polyamide resin, a polyimide resin, or the like.

A driving current corresponding to a gate signal supplied through a corresponding gate line and a data signal supplied through a corresponding data line can be supplied to each light emitting element 500. For example, a driving circuit electrically connected to the light emitting element 500 can be located in each pixel. The driving circuit can control the operation of the light emitting element 500 according to the gate signal and the data signal. For example, the driving circuit can include a second thin film transistor 300, and a storage capacitor 710.

The second thin film transistor 300 can be formed through a process different from the first thin film transistor 200 of the first area DA. For example, the second thin film transistor 300 can be located on a second separation insulating film 130 of the first thin film transistor 200. The second separation insulating film 130 can include an insulating material. The second separation insulating film 130 can include a material different from the first interlayer insulating film 240. For example, the second separation insulating film 130 can include a silicon oxide-based (SiOx) material.

For example, the structure of the second thin film transistor 300 can include a second semiconductor pattern 310, a second gate insulating film 320, a second gate electrode 330, and a second interlayer insulating film 340, a second source electrode 350, and a second drain electrode 360.

The second semiconductor pattern 310 can be located close to the second separation insulating film 130. For example, the second semiconductor pattern 310 can directly contact the second separation insulating film 130. The second semiconductor pattern 310 can include a semiconductor material. For example, the second semiconductor pattern 310 can include an oxide semiconductor such as IGZO, or the like.

The second semiconductor pattern 310 can include a second source region, a second drain region, and a second channel region. The second channel region can be located between the second source region and the second drain region. Resistance of the second source region and resistance of the second drain region can be lower than resistance of the second channel region. For example, the second source region and the second drain region can be regions modified to act as a conducting material. The second channel region can be a region not modified to act as a conducting material. For example, a doping process can be performed for enabling the second source region and the second drain region to act as a conducting material.

The second gate insulating film 320 can be located on the second semiconductor pattern 310. The second gate insulating film 320 can include an insulating material. For example, the second gate insulating film 320 can include a silicon oxide-based (SiOx) material, a silicon nitride-based (SiNx) material, and/or a material with a high dielectric constant (high-k) material. The second gate insulating film 320 can have a multilayer structure.

The second gate electrode 330 can be located on the second gate insulating film 320. For example, the second gate electrode 330 can overlap a second channel region of the second semiconductor pattern 310. For example, the second gate insulating film 320 can include a second source contact hole and a second drain contact hole which expose at least a part of the second source region, and at least a part of the second drain region, of the second semiconductor pattern 310, respectively.

The second gate electrode 330 can include a conductive material. For example, the second gate electrode 330 can include a metal such as aluminum (Al), chromium (Cr), copper (Cu), titanium (Ti), molybdenum (Mo), tungsten (W), or the like.

The second interlayer insulating film 340 can be disposed on or over the second semiconductor pattern 310 and the second gate electrode 330. The second interlayer insulating film 340 can include an insulating material. The second interlayer insulating film 340 can include a material different from the first interlayer insulating film 240. For example, the second interlayer insulating film 340 can include a silicon oxide-based material (SiOx).

The second source electrode 350 can be located on the second interlayer insulating film 340. The second source electrode 350 can be electrically connected to the second source region of the second semiconductor pattern 310. For example, the second interlayer insulating film 340 can include a second source contact hole exposing at least a part of the second source region of the second semiconductor pattern 310. A part of the second source electrode 350 can overlap the second source region of the second semiconductor pattern 310.

The second source electrode 350 can include a conductive material. For example, the second source electrode 350 can include a metal such as aluminum (Al), chromium (Cr), molybdenum (Mo), tungsten (W), titanium (Ti), copper (Cu), or the like. The second source electrode 350 can include the same material as the first source electrode 250.

The second drain electrode 360 can be located on the second interlayer insulating film 340. The second drain electrode 360 can be electrically connected to the second drain region of the second semiconductor pattern 310. For example, the second interlayer insulating film 340 can include a second drain contact hole exposing at least a part of the second drain region of the second semiconductor pattern 310. A part of the second drain electrode 360 can overlap the second drain region of the second semiconductor pattern 310.

The second drain electrode 360 can include a conductive material. For example, the second drain electrode 360 can include a metal such as aluminum (Al), chromium (Cr), molybdenum (Mo), tungsten (W), titanium (Ti), copper (Cu), or the like. The second drain electrode 360 can include the same material as the second source electrode 350. For example, the second drain electrode 360 can be formed by the same process as the second source electrode 350.

The second source electrode 350 and the second drain electrode 360 can have a multilayer structure. For example, the second source electrode 350 and the second drain electrode 360 can be made up of three layers. When the second source electrode 350 and the second drain electrode 360 are made up of three layers, the top layer and the bottom layer can be a titanium (Ti) metal layer, and the intermediate layer located between the top layer and the bottom layer can be an aluminum (Al) metal layer.

The storage capacitor 710 can be formed between the substrate 100 and the second thin film transistor 300. For example, the storage capacitor 710 can include a first storage electrode 711 disposed on the same layer as the first gate electrode 230 disposed in the first area DA, and a second storage electrode 712 disposed in the same layer as the second storage electrode 420 disposed in the first area DA and located on the first storage electrode 711.

The second electrode 530A disposed in the second area is located within an area overlapping the capacitor electrode 711 disposed in the second area.

The thin film transistor 300 disposed in the first area is disposed in a layer different from a layer in which a thin film transistor 300 disposed in the second area is disposed.

The first storage electrode 711 can include a conductive material. The first storage electrode 711 can include a metal such as aluminum (Al), chromium (Cr), molybdenum (Mo), tungsten (W), titanium (Ti), copper (Cu), or the like. The first storage electrode 711 can include the same material as the first gate electrode 230 of the first area DA. For example, the first storage electrode 711 can be formed by the same process as the first gate electrode 230 of the first area DA.

The second storage electrode 712 can include a conductive material. The second storage electrode 712 can include a metal such as aluminum (Al), chromium (Cr), molybdenum (Mo), tungsten (W), titanium (Ti), copper (Cu), or the like. The first interlayer insulating film 240 can extend to run between the first storage electrode 711 and the second storage electrode 712. The second storage electrode 712 can be located on the first interlayer insulating film 240.

The first separation insulating film 120 can include an insulating material. For example, the first separation insulating film 120 can include a silicon oxide-based material (SiOx) and/or a silicon nitride-based material (SiNx). The first separation insulating film 120 can have a multilayer structure.

The first storage electrode 711 can be electrically connected to the second drain electrode 360 of the second thin film transistor 300. For example, a first intermediate electrode 610 can be disposed that is connected to the first storage electrode 711 by passing through the first interlayer insulating film 240, the first separation insulating film 120, the second separation insulating film 130, the second gate insulating film 320, and the second interlayer insulating film 340. In this situation, the second drain electrode 360 can be connected to the first intermediate electrode 610. The first intermediate electrode 610 can include a conductive material. For example, the first intermediate electrode 610 can include a metal such as aluminum (Al), chromium (Cr), molybdenum (Mo), tungsten (W), titanium (Ti), copper (Cu), or the like. The second source electrode 350 can include the same material as the second drain electrode 360. For example, the first intermediate electrode 610 can be formed by the same process as the second source electrode 350 and the second drain electrode 360.

A buffer insulating film 110 can be located between the substrate 100 and a driving circuit (e.g., at least one thin film transistor and at least one storage capacitor) of each sub-pixel. The buffer insulating film 110 can prevent contamination by the substrate 100 in a process of forming the driving circuit. For example, the buffer insulating film 110 can include a silicon oxide-based (SiOx) material and/or a silicon nitride-based (SiNx) material. The buffer insulating film 110 can have a multilayer structure. For example, the buffer insulating film 110 can have a stacked structure including a first buffer insulating film 111 and a second buffer insulating film 112 including a material different from the first buffer insulating film 111.

A first planarization layer 140 and a second planarization layer 150 can be sequentially stacked between the second thin film transistor 300 and the light emitting element 500 of each sub-pixel. The first planarization layer 140 and the second planarization layer 150 can remove a step difference due to a driving circuit of each pixel. For example, a surface of the second planarization layer 150 facing the light emitting element 500 of each sub-pixel can be a flat surface. The first planarization layer 140 and the second planarization layer 150 can include an insulating material. The first planarization layer 140 and the second planarization layer 150 can include a material different from the second interlayer insulating film 340. For example, the first planarization layer 140 and the second planarization layer 150 can include an organic insulating material. The second planarization layer 150 can include a material different from the first planarization layer 140.

The light emitting element 500 of each sub-pixel can be electrically connected to the second thin film transistor 300 of the corresponding pixel, and the first electrode 510 can be electrically connected to the second drain electrode 360 through a first connection electrode 620. For example, the first connection electrode 620 can be located between the first planarization layer 140 and the second planarization layer 150. The first connection electrode 620 can be connected to the second drain electrode 360 by passing through the first planarization layer 140, and the first electrode 510 can be connected to the first connection electrode 620 by passing through the second planarization layer 150.

The first connection electrode 620 can include a conductive material. For example, the first connection electrode 620 can include a metal such as aluminum (Al), chromium (Cr), molybdenum (Mo), tungsten (W), titanium (Ti), copper (Cu), or the like.

The light emitting element 500 of each sub-pixel can be independently driven. For example, the first electrode 510 of each sub-pixel can be insulated from the first electrode 510 of an adjacent sub-pixel. An edge of each first electrode 510 can be covered by a bank/spacer insulating film 160 including a bank insulating film 161 and a spacer insulating film 162. The bank/spacer insulating film 160 can be located on the second planarization layer 150. The emission layer 520 and the second electrode 530A of each pixel can be disposed on the corresponding first electrode 510 exposed by the bank/spacer insulating film 160. The bank/spacer insulating film 160 can include an insulating material. For example, the bank/spacer insulating film 160 can include an organic insulating material. The bank/spacer insulating film 160 can include a material different from that of the second planarization layer 150.

At least a part of the emission layer 520 of each sub-pixel can extend to run along the bank/spacer insulating film 160. For example, the first organic layer and the second organic layer of each sub-pixel can be connected to the first organic layer and the second organic layer of an adjacent sub-pixel, respectively. The light emitting material layer EML of each sub-pixel can be spaced apart from the light emitting material layer EML of an adjacent sub-pixel.

A part of the second electrode 530A of each pixel corresponding to the light-transmitting portion AG of the second area CA can be removed through a laser patterning process. In the laser patterning process of the second electrode 530A, the second electrode 530A can be removed by using the first storage electrode 711 as a mask. For example, as a part of the second electrode 530A, in which the first storage electrode 711 is present, is protected from a laser beam irradiated to the display panel 900, the part of the second electrode 530A cannot be removed from the laser beam, and as a part of the second electrode 530A, in which the first storage electrode 711 is not present, is exposed to the laser beam, this part of the second electrode 530A can be removed to form a light-transmitting portion AG.

The light-transmitting portion AG can include a part that does not extend onto the bank/spacer insulating film 160 because the second electrode 530A corresponding to the light-transmitting portion AG is removed. For example, the second electrode 530A of each sub-pixel can include a part not connected to the second electrode 530A of an adjacent pixel.

Figure 6:
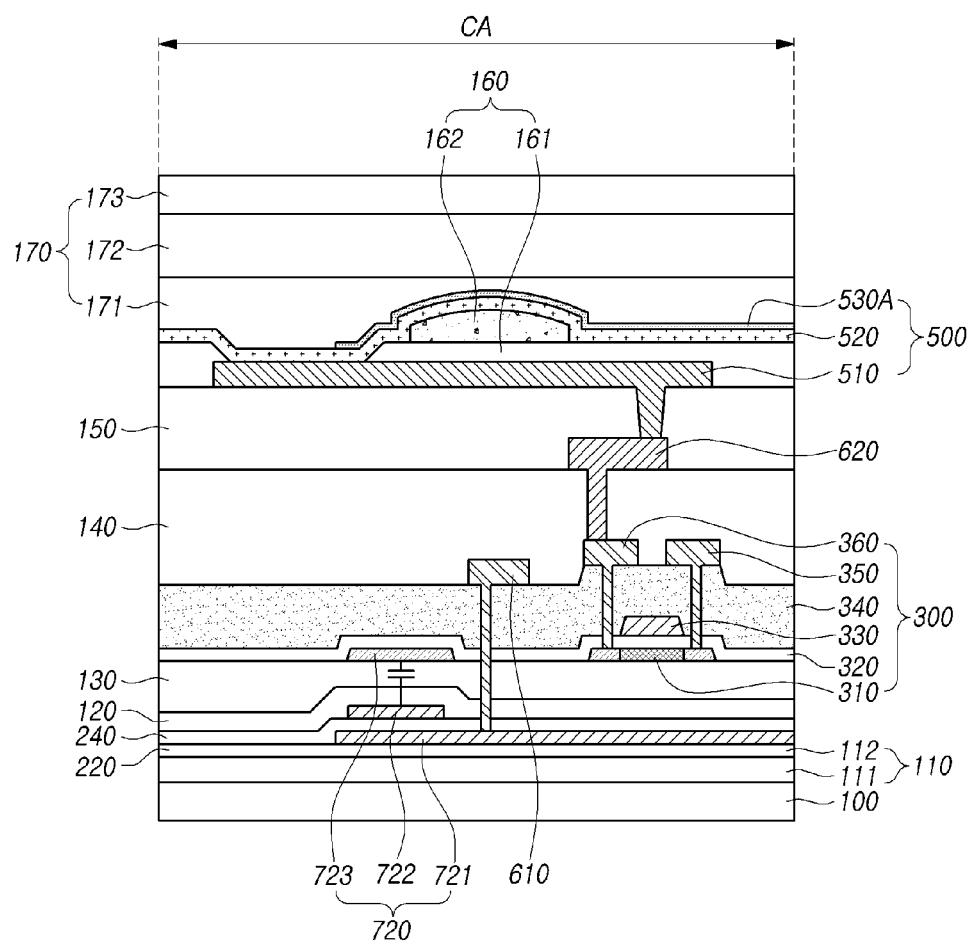
Figure 7:
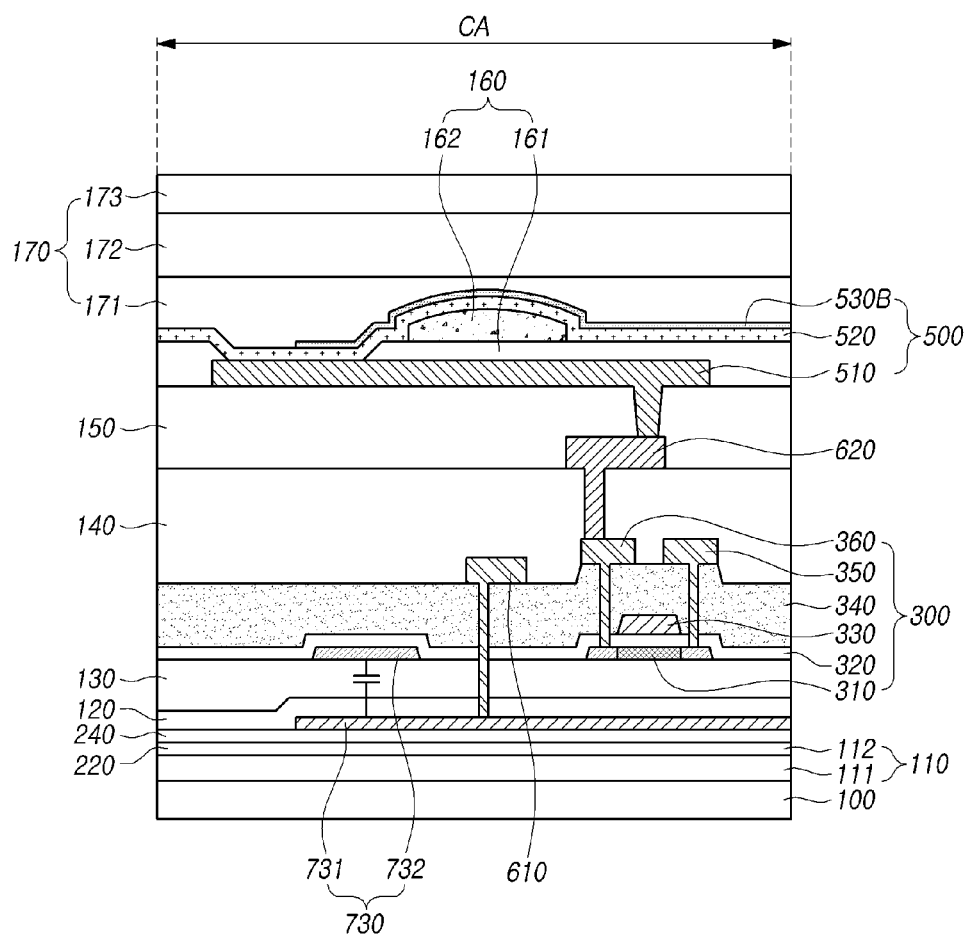

FIGS. 6 and 7 illustrate second areas CA included in the display panel 900 in other embodiments according to aspects of the present disclosure. A first thin film transistor 200, a second thin film transistor 300, a storage capacitor 400, and a light emitting element included in a first area DA included in each of the display panels of FIGS. 6 and 7 can be the same as or substantially the same as to those illustrated in FIG. 4. Further, a second thin film transistor 300, a light emitting element 500, an encapsulation portion 170, and a bank/spacer insulating film 160 included in the second area CA thereof can be the same as or substantially the same as to those illustrated in FIG. 5.

Referring to FIG. 6, a storage capacitor 720 includes a first storage electrode 721, a second storage electrode 722, and a third storage electrode 723. The first storage electrode 721 and the second storage electrode 722 can be substantially equal to the first storage electrode 711 and the second storage electrode 712 of FIG. 5. The third storage electrode of FIG. 6 can be located on the second separation insulating film 130 and formed of an oxide semiconductor modified to act as a conducting material. For example, the third storage electrode 723 can include an oxide semiconductor such as IGZO, and can be modified to act as a conducting material by a doping process.

Referring to FIG. 7, a storage capacitor 730 includes a first storage electrode 731 and a second storage electrode 732. The first storage electrode 731 can be substantially equal to the second storage electrode 712 of FIG. 5, and the second storage electrode 732 can be substantially equal to the third storage electrode 723 of FIG. 6. The second storage electrode 732 of FIG. 7 can be located on the second separation insulating film 130 and formed of an oxide semiconductor modified to act as a conducting material. For example, the second storage electrode 732 can include an oxide semiconductor such as IGZO, and can be modified to act as a conducting material by a doping process.

Referring to FIG. 7, a part of a second electrode 530B corresponding to a light-transmitting portion AG of the second area CA can be removed through a laser patterning process. In the laser patterning process of the second electrode 530B, the second electrode 530B can be removed by using the first storage electrode 731 as a mask. For example, as a part of the second electrode 530B, in which the first storage electrode 731 is present, is protected from a laser beam irradiated to the display panel 900, the part of the second electrode 530B cannot be removed from the laser beam, and as a part of the second electrode 530B, in which the first storage electrode 731 is not present, is exposed to the laser beam, this part of the second electrode 530B can be removed to form a light-transmitting portion AG.

The light-transmitting portion AG can include a part that does not extend onto the bank/spacer insulating film 160 because the second electrode 530B corresponding to the light-transmitting portion AG is removed. For example, the second electrode 530B of each sub-pixel can include a part not connected to the second electrode 530B of an adjacent pixel.

The discussions given above and accompanying drawings are merely exemplary in nature and are not intended to limit the disclosure or its application. It should be noted that various modifications and variations such as combination, separation, substitution, and changes of configurations in the described examples and embodiments will be readily apparent to those skilled in the art, without departing from the scope of the embodiments and examples of present disclosure. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The scope of protection of the present disclosure is to be construed according to the claims, and all technical ideas within the scope of the claims should be interpreted as being included in the scope of the present invention.

What is claimed is:
1. A display panel comprising:
a first area including a first plurality of subpixels;
a second area including a second plurality of subpixels; and
at least one light-transmitting portion disposed between adjacent subpixels among the second plurality of subpixels in the second area, wherein a first subpixel among the first plurality of
subpixels in the first area includes:
a first light emitting layer;
a first thin film transistor including a first channel area; and
a first conductive member disposed under and overlapping with the first channel area of the first thin film transistor,
wherein a second subpixel among the second plurality of subpixels in the second area includes:
a second light emitting layer;
a second thin film transistor including a second channel area; and
a second conductive member disposed under and overlapping with the second channel area of the second thin film transistor,
wherein the first conductive member in the first subpixel in the first area is disposed in a different layer from the second conductive member in the second subpixel in the second area, and
wherein the display panel further comprises an insulating layer disposed between the first conductive member and the second conductive member.

2. The display panel according to claim 1, further comprising:
a substrate on which at least a portion of the first subpixel and at least a portion of the second subpixel are disposed,
wherein the first conductive member is disposed in a higher layer relative to the substrate than the second conductive member.

3. The display panel according to claim 2, wherein an additional layer or a material different from respective material of the first and second conductive members is disposed between a lower surface of the first conductive member and a lower surface of the second conductive member.

4. The display panel according to claim 1, wherein the first and second conductive members are configured to serve the substantially same conducting function in the respective first and second subpixels.

5. The display panel according to claim 1, wherein the first and second subpixels further include third and fourth conductive members disposed on the insulating layer, respectively, and
wherein the first and second conductive members at least in part overlap with the third and fourth conductive members, respectively.

6. The display panel according to claim 1, wherein both of the first conductive member and the second conductive member include molybdenum.

7. The display panel according to claim 1, wherein the first conductive member in the first subpixel has a different structure than the second conductive member in the second subpixel.

8. The display panel according to claim 1, further comprising:
an insulating layer disposed in the first and second subpixels,
wherein both of the first conductive member and the second conductive member are disposed under the insulating layer.

9. The display panel according to claim 8, wherein the first conductive member includes titanium and the second conductive member includes molybdenum.

10. The display panel according to claim 1, wherein the second area includes a plurality of light-transmitting portions, and
wherein a first light-transmitting portion among the plurality of light-transmitting portions located at an outer boarder of the second area has a different shape than a second light-transmitting portion among the plurality of light-transmitting portions located at a center area of the second area.

11. The display panel according to claim 1, wherein the second plurality of subpixels include a group of subpixels disposed between two adjacent light-transmitting portions, and the group of subpixels includes a color ratio of 1:2:1 for red, green and blue subpixels.

12. A display panel comprising:
a first area including a first plurality of subpixels;
a second area including a second plurality of subpixels; and
at least one light-transmitting portion disposed between adjacent subpixels among the second plurality of subpixels in the second area,
wherein at least one subpixel among the second plurality of subpixels includes:
a first electrode;
a second electrode;
a light emitting layer disposed between the first electrode and the second electrode;
a thin film transistor electrically connected to the first electrode, the thin film transistor including a channel area; and
a conductive member including a first conductive layer and a second conductive layer,
wherein a portion of at least one of the first conductive layer and the second conductive layer is disposed under and overlaps with the channel area of the thin film transistor, and
wherein the conductive member is a capacitor.

13. The display panel according to claim 12, wherein the channel area of the thin film transistor includes low temperature poly-silicon (LTPS) or an oxide semiconductor.

14. The display panel according to claim 12, wherein an insulating layer is disposed between the first conductive layer and the second conductive layer.

15. The display panel according to claim 14, wherein at least one of the first conductive layer and the second conductive layer includes molybdenum.

16. The display panel according to claim 14, wherein a second subpixel among the first plurality of subpixels in the first area includes:
a first electrode;
a second electrode;
a light emitting layer disposed between the first electrode and the second electrode;
a second thin film transistor electrically connected to the first electrode, the thin film transistor including a channel area; and
a second conductive member disposed under and overlapping with the channel area of the second thin film transistor, and
wherein the insulating layer is disposed between the second thin film transistor and the second conductive member of the at least one subpixel among the first plurality of subpixels.

17. The display panel according to claim 12, wherein the second area includes a plurality of light-transmitting portions, and wherein a first light-transmitting portion among the plurality of light-transmitting portions located at an outer boarder of the second area has a different shape than a second light-transmitting portion among the plurality of light-transmitting portions located at a center area of the second area.

18. The display panel according to claim 12, wherein the second plurality of subpixels include a group of subpixels disposed between two adjacent light-transmitting portions, and the group of subpixels includes a color ratio of 1:2:1 for red, green and blue subpixels.

19. A display panel comprising:
a first area including a first plurality of subpixels;
a second area including a second plurality of subpixels; and
at least one light-transmitting portion disposed between adjacent subpixels among the second plurality of subpixels in the second area,
wherein at least one subpixel among the first plurality of subpixels or the second plurality of subpixels includes:
a first electrode;
a second electrode;
a light emitting layer disposed between the first electrode and the second electrode;
a thin film transistor electrically connected to the first electrode, the thin film transistor including a channel area; and
a conductive member including a first conductive layer and a second conductive layer,
wherein a portion of at least one of the first conductive layer and the second conductive layer is disposed under and overlaps with the channel area of the thin film transistor,
wherein the second area includes a plurality of light-transmitting portions, and
wherein a first light-transmitting portion among the plurality of light-transmitting portions located at an outer boarder of the second area has a different shape than a second light-transmitting portion among the plurality of light-transmitting portions located at a center area of the second area.

20. The display panel according to claim 19, wherein the second plurality of subpixels include a group of subpixels disposed between two adjacent light-transmitting portions, and the group of subpixels includes a color ratio of 1:2:1 for red, green and blue subpixels.

21. The display panel according to claim 19, wherein the second area includes a plurality of light-transmitting portions arranged in a grid arrangement or a lattice arrangement.

* * * * *